United States Patent [19]

Fukuda et al.

[11] Patent Number: 5,362,926
[45] Date of Patent: Nov. 8, 1994

[54] CIRCUIT SUBSTRATE FOR MOUNTING A SEMICONDUCTOR ELEMENT

[75] Inventors: Makoto Fukuda; Naomi Yonemura; Chiharu Watanabe, all of Shibukawa, Japan

[73] Assignee: Denki Kagaku Kogyo Kabushiki Kaisha, Tokyo, Japan

[21] Appl. No.: 917,971

[22] Filed: Jul. 24, 1992

[30] Foreign Application Priority Data

Jul. 24, 1991 [JP] Japan .................. 3-206146
Jul. 24, 1991 [JP] Japan .................. 3-206151
Jul. 26, 1991 [JP] Japan .................. 3-208780
Jan. 28, 1992 [JP] Japan .................. 4-037307

[51] Int. Cl.$^5$ .................................. H05K 1/09
[52] U.S. Cl. ........................ 174/256; 174/258
[58] Field of Search ............... 174/258, 259, 260, 256, 174/255, 52.4; 29/830, 831, 842, 846; 156/151

[56] References Cited

U.S. PATENT DOCUMENTS

| 3,328,275 | 6/1967 | Waterbury | 156/151 |
| 4,521,476 | 6/1985 | Asai et al. | 428/209 |
| 4,987,677 | 1/1991 | Tanaka | 29/846 |
| 5,049,221 | 9/1991 | Wada | 156/151 |

FOREIGN PATENT DOCUMENTS

| 0339881 | 11/1989 | European Pat. Off. . |
| 1-15153 | 3/1989 | Japan . |
| 3-108347 | 5/1991 | Japan . |
| 3-272190 | 12/1991 | Japan . |
| 2125618 | 3/1984 | United Kingdom . |

OTHER PUBLICATIONS

European Patent Application 0339881.
Patent Abstracts of Japan, vol. 11, No. 244 (E-530), Aug. 8, 1987, & JP-A-62-054-947, Mar. 10, 1987, Kawanobe Sunao, "Metal Strip for Lead Frame".
Patent Abstracts of Japan, vol. 11, No. 41 (E-478), Feb. 6, 1987, & JP-A-61-207-044, Sep. 13, 1986, Shoji Takashi, et al., "Formation of Circuit of Thermal Spraying Substrate".
Patent Abstracts of Japan, vol. 9, No. 8 (E-289), Jan. 12, 1985, & JP-A-59-158-544, Sep. 8, 1984, Hirai Hideo, et al., "Circuit Substrate and Manufacture Thereof".

Primary Examiner—Leo P. Picard
Assistant Examiner—Christopher Horgan
Attorney, Agent, or Firm—Oblon, Spivak, McClelland, Maier & Neustadt

[57] ABSTRACT

A circuit substrate for mounting a semiconductor element comprises an aluminum-copper clad foil laminated on a metallic base plate by interposing an insulating layer, wherein the roughness in average of the surface in contact with the insulating layer of the aluminum-copper clad foil is in a range of from 0.5 μm to 50 μm.

19 Claims, 3 Drawing Sheets

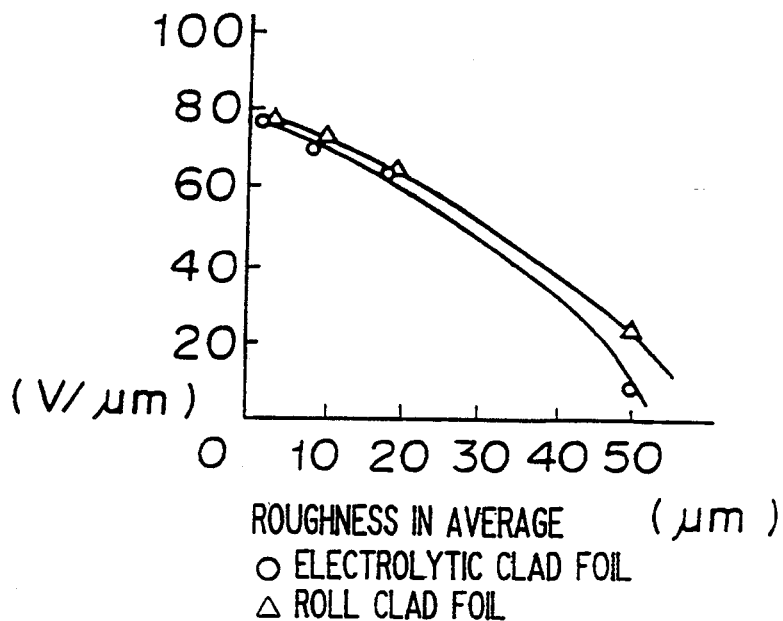
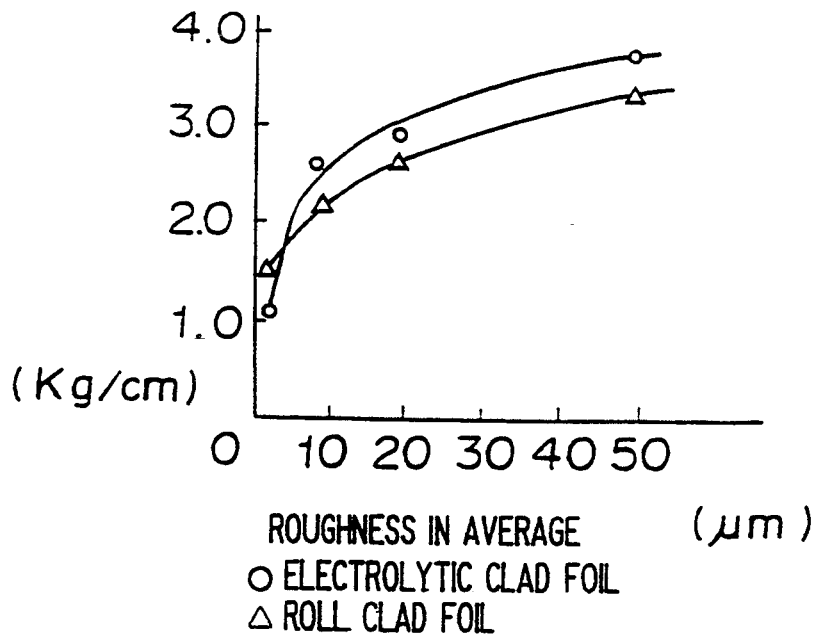

CIRCUIT SUBSTRATE FOR MOUNTING A SEMICONDUCTOR ELEMENT

The present invention relates to a circuit substrate for mounting a semiconductor element used for electric devices, communicating devices and automobiles. More particularly, the present invention relates to a highly reliable circuit substrate for mounting a semiconductor element having an improved bonding strength between a metallic foil for forming a circuit and an insulating layer; a high resistance to voltage, and excellent wire bonding property.

There have been used a copper foil, a nickel-plated copper foil and an aluminum-copper clad foil as an electric conductive foil used for a circuit substrate for mounting a semiconductor element which is used mainly for electric devices, communication devices and automobiles. In recent years, these foils have been used in various fields, and there are demands of circuit substrates capable of high density packaging, and having a high voltage resistance property, excellent wire bonding property and providing high reliability. For instance, U.S. Pat. No. 4,521,476 discloses a process for preparing a hybrid integrated circuit substrate having a circuit which is formed of an aluminum-copper clad foil laminated on a metallic base plate through an insulating layer. Japanese Examined Patent Publication No. 15153/1989 discloses a circuit substrate in which an aluminum-copper bonding foil is used. Further, Japanese Unexamined Patent Publication No. 108347/1991 disclose a wire bonding method using an aluminum wire and a gold wire. However, the conventional techniques do not satisfy the demands described above. For instance, when a conventional circuit substrate has been used for a power module to which a large current or a high voltage has been applied, the bonding strength (peel strength) between the circuit formed of an aluminum-copper clad foil and the insulating layer and the voltage-withstanding characteristic have not been sufficient, and accordingly, reliability has been low. Further, there has been a problem that the bonding strength between the circuit and electronic devices such as semiconductors at connecting portions formed by wire bonding an aluminum wire or a gold wire has been insufficient and unstable, and therefore, reliability has been insufficient.

It is an object of the present invention to provide a circuit substrate for mounting a semiconductor element having a large bonding strength between a circuit of an aluminum-copper clad foil and an insulating layer, an improved voltage breakdown strength characteristic and reliable strength of wire bonding. The inventors of this application have studied on the roughness of the surface in contact with the insulating layer of the aluminum-copper clad foil, the roughness of the surface of the foil in contact with a bonding wire and the quality of an aluminum foil, which are factors influencing the above-mentioned characteristics, and have achieved the present invention by finding a circuit substrate of high reliability.

Namely, in accordance with the present invention, there is provided a circuit substrate for mounting a semiconductor element having an aluminum-copper clad foil laminated on a metallic base plate by interposing an insulating layer, characterized in that the roughness in average of the surface in contact with the insulating layer of the aluminum-copper clad foil is in a range of from 0.5 $\mu$m to 50 $\mu$m.

In the present invention, the aluminum-copper clad foil is such one that a copper foil is formed on an aluminum foil by electrolytic plating, or the clad foil is prepared by a rolling method. The aluminum foil is made of pure aluminum including more than 99.0% by weight of aluminum or made of an aluminum alloy.

The roughness in average of the surface opposing the surface in contact with the insulating layer of the aluminum-copper clad foil is 10 $\mu$m or lower.

Further, in accordance with the present invention, there is provided a power module in which a semiconductor element is mounted on a circuit substrate comprising an aluminum-copper clad foil whose roughness in average of the surface in contact with the insulating layer is in a range of from 0.5 $\mu$m to 50 $\mu$m, the semiconductor element and a circuit formed in the circuit element are connected by wire bonding and arranged in a package such as a plastic material, and are sealed with an insulating material such as silicone resin.

In drawings:

FIG. 4 is a graph showing relations between voltage breakdown strength and roughness in average of surfaces in contact with the insulating layer of aluminum-copper clad foils;

FIG. 5 is a graph showing relations between peel strength and roughness in average of surfaces in contact with the insulating layer of aluminum-copper clad foils;

In the following, preferred embodiments of the circuit substrate for mounting a semiconductor element will be described in more detail with reference to the drawings.

In description, the roughness in average of the surface is expressed by Rz which is defined in JIS (Japanese Industrial Standard)-B0601.

Figure 1:
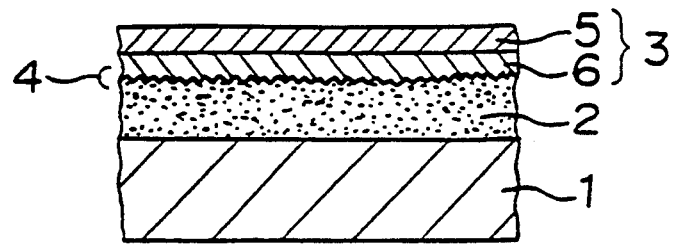
FIG. 1 is an enlarged cross-sectional view of an embodiment of the circuit substrate comprising an aluminum-copper clad foil in which an aluminum foil is formed at the top surface.

FIG. 1 is an enlarged cross-sectional view of an embodiment of the circuit substrate of the present invention. In FIG. 1, an aluminum-copper clad foil 3 is laminated on a metallic base plate 1 by interposing an insulating layer 2 with an aluminum foil 5 being formed at the uppermost layer, wherein the aluminum-copper clad foil 3 has a roughness 4 in average of the surface in contact with the insulating layer.

Figure 2:
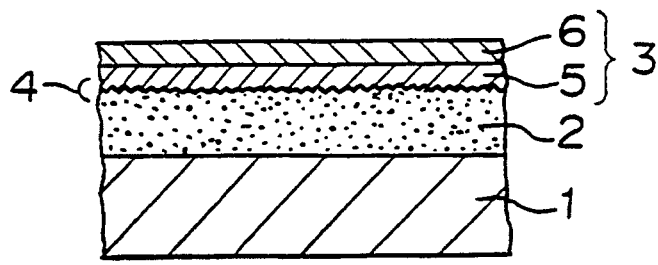
FIG. 2 is an enlarged cross-sectional view of another embodiment of the circuit substrate comprising an aluminum-copper clad foil in which a copper foil is formed at the top surface.

In FIG. 2, an aluminum-copper clad foil 3 is formed on the base plate 1 by interposing the insulating layer with a copper foil 6 disposing at the uppermost layer, wherein the clad foil has a roughness 4 in average at the surface in contact with the insulating layer.

Figure 3:
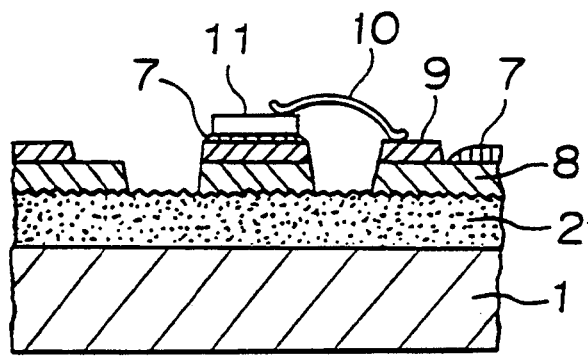
FIG. 3 is an enlarged cross-sectional view of an embodiment of the circuit substrate on which an electric conductive circuit is formed and a semiconductor element is mounted.

FIG. 3 is an enlarged cross-sectional view showing an embodiment of the circuit substrate for mounting a semiconductor element wherein a semiconductor element and other electric devices are mounted on it. FIGS. 4 and 5 respectively show relations among the voltage breakdown strength, the peel strength and the roughness Rz in average of the surfaces in contact with the insulating layer of the aluminum-copper clad foils.

As a metallic base plate 1 used for the circuit substrate of the present invention, aluminum, aluminum alloy, copper, copper alloy, iron, stainless steel and so on having good thermal conductivity can be used. A metallic base plate 1 having a thickness in a range of 0.5 mm–3.0 mm is generally used, but it is not limited thereto.

The insulating layer 2 used for the present invention may be an insulating layer of high molecular resin which may contain ceramics or inorganic filler, a high molecular resin layer containing glass fibers or a heat-resisting an insulating layer of high molecular resin. The thickness of the insulating layer 2 is not particularly limited unless failure of insulation takes place. Generally, an insulating layer having a thickness of 20 $\mu$m or more is used. As inorganic powder used for the insulating layer 2, alumina, silica, beryllia, boron nitride, magnesia, silicon nitride, aluminum nitride, silicon carbide or the like may be used. As the high molecular resin, epoxy resin, phenol resin, polyimide resin and various kinds of engineering plastics may be used.

As the material of aluminum of the aluminum-copper clad foil 3 used for the present invention, pure aluminum and aluminum alloy used for an extensible material of aluminum alloy in the JIS Rule (Aluminum Handbook, edited by Shadan Hojin Keikinzoku Kyokai, The 4th Edition, 1990, p.15, Table 2.1) can be used. The major elements incorporated in the aluminum alloy are Cu, Mn, Si, Mg and so on. There can be used alloy which comprises at least one selected from the group consisting of an alloy containing Cu of 0.30–7.0% by weight, an alloy containing Mn of 0.1–2.0% by weight, an alloy containing Si of 2.0–15% by weight and an alloy containing Mg of 0.5–6.0% by weight.

Since the hardness of pure aluminum is soft and the extension property is high, it deforms at the time of wire bonding and there causes sinking of the wire used. When an aluminum alloy foil is used, an amount of sinking of the aluminum alloy foil is small. Accordingly, it is possible to connect a lead wire under wide wire bonding conditions (an output and a bonding time).

The aluminum-copper clad foil is prepared by a plating method or a rolling method. In the case of plating method, zinc, tin or nickel may be plated between an aluminum layer and a copper layer in order to increase the bonding strength between aluminum and copper. When zinc or tin is subjected to substituting plating with a thickness of 10Å–1 $\mu$m as a substituting layer between the aluminum layer and the copper layer, and then copper plating is conducted at a thickness of about 5 $\mu$m–900 $\mu$m, an excellent bonding force is obtainable between the aluminum layer and the copper layer in comparison with a technique that nickel plating is conducted between the aluminum layer and the copper layer. Thus, a highly reliable electric conductive circuit can be formed.

When the copper foil is formed by electrolytics plating, the roughness of the surface of the copper layer can be adjusted by adjusting the density of an electric current supplied. For instance, an electrolytic copper foil having an average roughness of 0.5 $\mu$m–50 $\mu$m can be formed by feeding a current having a density of 4 A/dcm$^2$ or lower. Further, an electrolytic copper foil having an average roughness of 20 $\mu$m can be formed by supplying a current having a density of 3 A/dcm$^2$. Further, an electrolytic copper foil having an average roughness of 10 $\mu$m can be formed by feeding a current having a density of 2 A/dcm$^2$.

When the aluminum-copper clad foil is prepared by a rolling method, it is possible to obtain a clad foil having a large thickness which is suitable for a large current. Further, the rolling method provides a clad foil having a high bonding strength at the interface and durable to corrosion at the interface and a clad foil comprising a copper foil of high purity.

The thickness of the aluminum-copper clad foil 3 of the present invention is not in particular limited. For instance, the thickness of the clad foil is preferably in a range of 35 $\mu$m–1,000 $\mu$m for use for a large current. On the other hand, the thickness of the clad foil is desirably in a range of 9 $\mu$m–70 $\mu$m for use for a small current. The thickness of the aluminum foil is preferably in a range of 20 $\mu$m–80 $\mu$m for a large current use. However, when a fine circuit having the width of circuit of 200 $\mu$m or less is to be prepared, the thickness of the aluminum foil is preferably less than 10 $\mu$m and the thickness of the copper foil is preferably in a range of 1 $\mu$m–100 $\mu$m.

When the thickness of the aluminum foil is more than 10 $\mu$m, accuracy in the width of a circuit is poor, whereby it is difficult to form a fine circuit because an amount of side etching in an etching operation is large.

The roughness in average of the surface in contact with the insulating layer of the aluminum-copper clad foil 3 used for the present invention is in a range of 0.5 $\mu$m–50 $\mu$m. When the roughness in average is less than 0.5 $\mu$m, the bonding strength to the insulating layer 2 is small, and the aluminum-copper clad foil 3 is easily peeled off. On the other hand, when the roughness exceeds 50 $\mu$m, there occurs concentration of an electric field at the top of projections of concave and recess portions of the surface of the clad foil, and the voltage breakdown characteristic is greatly reduced.

When the aluminum-copper clad foil is used for a field which requires a high peel strength, it is preferably that the roughness in average of the surface in contact with the insulating layer of the aluminum-copper clad foil 3 is in a range of 10 $\mu$m–50 $\mu$m. On the other hand, when it is used for a field requiring a high voltage breakdown characteristic, it is preferable that the roughness in average of the surface in contact with the insulating lawyer of the clad foil is in a range of 0.5 $\mu$m–20 $\mu$m. In particular, it is preferable that the roughness in a range of 0.5 $\mu$m–10 $\mu$m in use for a high voltage. On the other hand, when both peel strength and voltage breakdown characteristics are required, it is preferable that the roughness in average is in a range of 10 $\mu$m–20 $\mu$m. The thickness of the surface of the clad foil can be adjusted by controlling the density of an electric current when the copper foil is formed by the electrolytic plating as described above. Further, the roughness can be adjusted by mechanically polishing or chemically polishing. In particular, the latter methods are used for forming a roughened surface of the aluminum foil because electrolytic plating is not used for the aluminum foil.

Figure 6:
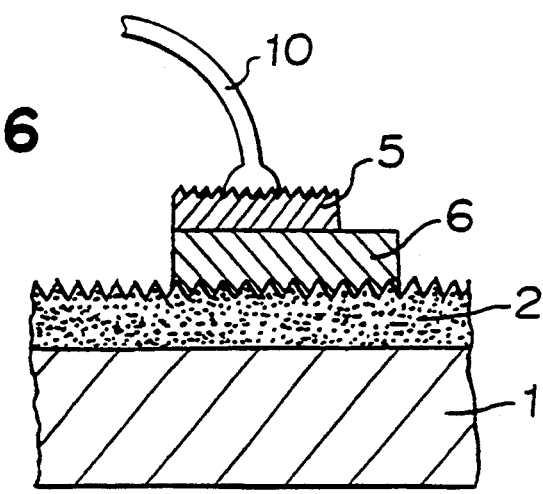
FIG. 6 is an enlarged cross-sectional view showing a wire bonded portion of the aluminum-copper clad foil (an aluminum layer at the top) of the present invention.
Figure 7:
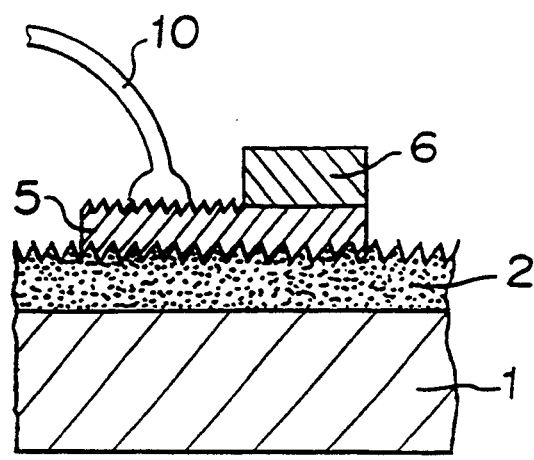
FIG. 7 is an enlarged cross-sectional view showing a wire bonded portion of the aluminum-copper clad foil (copper foil at the top) of the present invention.
Figure 8:
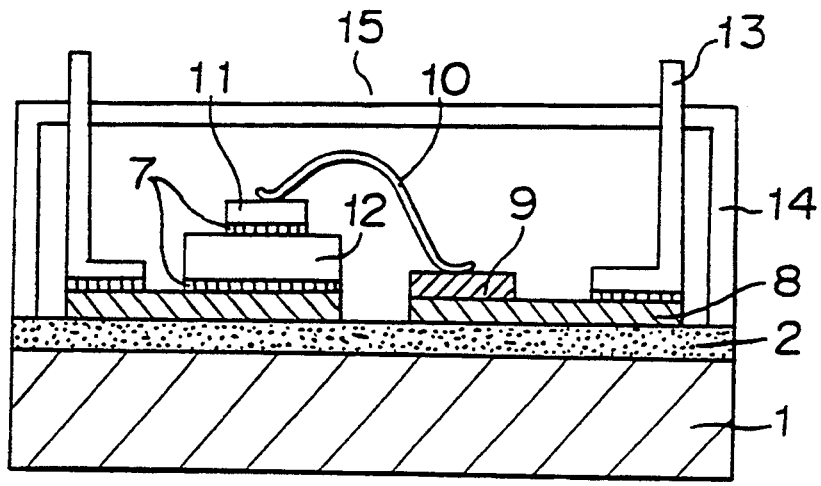
FIG. 8 is an enlarged cross-sectional view showing an embodiment of the power module according to the present invention.

A wire bonding portion of the aluminum-copper clad foil in the circuit substrate for mounting a semiconductor element of the present invention is classified into two cases: the aluminum foil being placed at the top surface (FIG. 6) and the copper foil being placed at the top surface (FIG. 7). In either case, the bonding portion is formed of a bonding wire and an aluminum foil. However, there is no change in the relation among the roughness in average of the surface in contact with the insulating layer of the aluminum-copper clad foil, the voltage breakdown characteristic and the bonding strength. In this case, the roughness in average of the surface of the aluminum foil is 10 $\mu$m or less, more preferably, 10 $\mu$m–1 $\mu$m. When the roughness exceeds 10 $\mu$m, a molten portion at the bonding portion of the bonding wire can not completely fill the uneven surface at the bonding portion of the aluminum foil, whereby there takes place a non-melt portion. This may cause failure of bonding and reliability on the bonding decreases. On the other hand, when the roughness is less than 1 $\mu$m, the surface area of contact between the molten portion of the bonding wire and the bonding area of the aluminum foil is small. The penetration of the molten portion into the bonding area of the aluminum foil is insufficient and the bonding strength is small. Accordingly, reliability is low.

EXAMPLE 1

FIG. 3 is a cross-sectional view of a circuit substrate for mounting a semiconductor element, on which a semiconductor element and other electrical devices are mounted.

The circuit substrate was prepared by applying silica-containing epoxy resin as an insulating layer 2 at a thickness of 100 $\mu$m on an aluminum substrate as a metallic base plate 1 having a thickness of 1.5 mm, and by bonding an aluminum-copper clad foil 3 comprising 40 $\mu$m of an aluminum foil—85 $\mu$m of a copper foil so as to place an aluminum foil 5 at the top surface. The clad foil used was such one that the copper is formed on the aluminum foil by electrolysis and the roughness in average (Rz) of the surface in contact with the insulating layer was 15 $\mu$m (measured by a surface roughness tester "Surfcoder", manufactured by Kosaka Kenkyusho).

Then, a resist was applied by a screen printing method on the circuit substrate having the same construction as in FIG. 1 (the thickness of the aluminum substrate: 1.5 mm, the thickness of insulating layer: 100 $\mu$m, and the thickness of the aluminum-copper clad foil: 40 $\mu$m–85 $\mu$m). Etching is conducted with ferric chloride to the aluminum-copper clad foil 3 to form a circuit. The resist was removed. A resist was again applied to portions which require an aluminum pad. An etching solution capable of selectively dissolving aluminum such as an alkali etching solution was used to remove unnecessary aluminum portions to expose copper foil portions. After the resist was removed, a semiconductor, a tip resistor and so on were mounted on copper conductive portions 8 of the circuit by means of solder 7, and the semiconductor element 11 and the aluminum pad 9 were connected by a wire 10 as an aluminum lead wire by using an ultrasonic vibration method.

EXAMPLE 2

Silica-containing epoxy resin as the insulating layer 2 was applied to each of metallic base plates 1 of aluminum of 1.5 mm thick at a thickness of 100 $\mu$m. Electrolytic clad foils comprising aluminum 40 $\mu$m-copper 85 $\mu$m and rolled clad foils 3 are respectively bonded to the circuit substrates so as to place aluminum foils 5 at the top surface. The voltage breakdown strength of the samples were measured by using model TOS 8700 (Kikusui Denshi Kogyo Kabushiki Kaisha) in accordance with JIS C2110. FIG. 4 shows the relation between the roughness in average of the surface in contact with the insulating layer of the clad foil and voltage breakdown strength.

EXAMPLE 3

Silica-containing epoxy resin as the insulating layer 2 was coated at a thickness of 100 $\mu$m on each of metallic base plates of the aluminum having a thickness of 1.5 mm. Electrolytic clad foils comprising aluminum 40 $\mu$m-copper 85 $\mu$m and rolled clad foils 3 were respectively bonded on the metallic base plates 1 so as to place aluminum foils 5 at the top surface to prepare samples of circuit substrates. The peel strength was measured for each of the samples by using Tensilon U-1160 (Toyo Boldwin Kabushiki kaisha) in accordance with JIS C-6481. FIG. 5 shows the relation of the roughness in average of the surface in contact with the insulating layer of the clad foils and the voltage breakdown strength.

EXAMPLE 4

The surface of the aluminum foils of the circuit substrates prepared in accordance with Example 3 was polished by using a SiC buff roll (tradename, Ultrasuper) manufactured by Kurenoton. The surface roughness of the samples were measured in the same manner as in Example 1. As a result, the roughness in average Rz was 9.2 $\mu$m. Then, semiconductor elements were mounted on the samples and wire bonding of 10,000 aluminum wires of 300 $\mu$m thick was conducted by using an ultrasonic wire bonder (wire bonder USW-5Z60S by Choonpa Kogyo Kaisha). As a result of tests, there was found no failure of bonding.

Samples of circuit substrate in which the roughness in average Rz of the aluminum surface was 12 $\mu$m were prepared in the same manner as in Example 3. Semiconductor elements were mounted on the samples and wire bonding of 10,000 gold wires of 25 $\mu$m thick was conducted. As a result of testing, there were found 80 numbers of failure of wire bonding.

EXAMPLE 5

Circuit substrates of Example 3 were prepared. A transistor bare chip 11 was attached to the circuit through a heat sink 12 by means of solder 7. Further, an electrode terminal 13 was soldered, and then, the transistor bare chip 11 was bonded to the bonding surface 9 of aluminum foil with an aluminum wire 10 of 300 $\mu$m thick by ultrasonic bonding. A plastic package was put on the circuit substrate with an adhesive agent, and silicone resin was used for sealing. Thus obtained transistor power modules 15 were used as controlling modules for inverter air conditioners by supplying power of AC 200 V and 20 A. As a result, they were able to withstand for a long term use without breakdown.

In accordance with the present invention, a circuit substrate for mounting a semiconductor element having a high peel strength and/or a high voltage breakdown characteristic can be obtained by specifying the surface roughness of the surface in contact with the insulating layer of the aluminum-copper clad foil. Further, such circuit substrate having high reliability of wire bonding can be obtained by specifying the surface roughness of the surface opposing the insulating layer of the aluminum-copper clad foil. Further, a power module for a high voltage and a high current and operable for a long time use can be obtained by using such circuit substrate for mounting a semiconductor element.

I claim:

1. A circuit substrate for mounting a semiconductor, which comprises an aluminum-copper clad foil laminated on a metallic base plate, having an insulating layer interposed between said clad foil and said base plate, wherein a side of said clad foil in contact with the insulating layer has a surface roughness in a range of from 0.5 μm to 50 μm; and wherein the insulating layer is made of a polymeric resin.

2. The circuit substrate according to claim 1, wherein the aluminum-copper foil is prepared by electrolytic plating a copper layer on an aluminum foil.

3. The circuit substrate according to claim 1, wherein the aluminum-copper clad foil is prepared by a rolling method.

4. The circuit substrate according to claim 1, wherein the aluminum-copper clad foil is composed of pure aluminum of 99.0% by weight or higher.

5. The circuit substrate according to claim 1, wherein aluminum in the aluminum-copper clad foil is aluminum alloy which comprises at least one selected from the group consisting of an alloy containing Cu of 0.30–7.0% by weight, an alloy containing Mn of 0.1–2.0% by weight, an alloy containing Si of 2.0–15% by weight and a alloy containing Mg of 0.5–6.0% by weight.

6. The circuit substrate according to claim 1, wherein the roughness of a surface of said clad foil opposing the surface in contact with the insulating layer of the aluminum-copper clad foil is 10 μm or less.

7. A power module comprising a circuit substrate for mounting a semiconductor element as claimed in claim 1 and a semiconductor mounted on the circuit substrate, wherein said circuit substrate and semiconductor are connected by wire bonding, and all constituent elements are arranged in a package.

8. The circuit substrate according to claim 1, wherein said metallic base plate is made of a material selected from the group consisting of aluminum, aluminum alloy, copper, copper alloy, iron and stainless steel.

9. The circuit substrate according to claim 1, wherein said polymeric resin further comprises an inorganic filler.

10. The circuit substrate according to claim 9, wherein said inorganic filler is a ceramic filler.

11. The circuit substrate according to claim 9, wherein said inorganic filler is glass fibers.

12. The circuit substrate according to claim 9, wherein said inorganic filler is a powder selected from the group consisting of alumina, silica, beryllia, boron nitride, magnesia, silicon nitride, aluminum nitride and silicon carbide.

13. The circuit substrate according to claim 1, wherein said polymeric resin is selected from the group consisting of epoxy resin, phenol resin and polyimide resin.

14. The circuit substrate according to claim 1, wherein said aluminum-copper clad foil has a thickness of from 35 μm to 1,000 μm.

15. The circuit substrate according to claim 14, wherein said aluminum-copper clad foil comprises an aluminum foil thereof having a thickness of from 20 μm to 80 μm.

16. The circuit substrate according to claim 1, wherein said aluminum-copper clad foil has a thickness of from 9 82 m to 70 μm.

17. The circuit substrate according to claim 16, wherein said aluminum-copper clad foil comprises an aluminum foil thereof having a thickness of less than 10 μm.

18. A circuit substrate for mounting a semiconductor element, which comprises an aluminum-copper clad foil laminated on a metallic base plate, having an insulating layer interposed between said clad foil and said base plate, wherein a side of said clad foil in contact with the insulating layer has a surface roughness of at least 0.5 μm, but less than 10 μm, wherein said insulating layer is made of a polymeric resin.

19. A circuit substrate for mounting a semiconductor element, which comprises an aluminum-copper clad foil laminated on a metallic base plate, having an insulating layer interposed between said clad foil and said base plate, wherein a side of said clad foil in contact with the insulating layer has a surface roughness in a range of from 10 μm to 20 μm, wherein said insulating layer is made of a polymeric resin.

* * * * *

UNITED STATES PATENT AND TRADEMARK OFFICE
CERTIFICATE OF CORRECTION

PATENT NO. : 5,362,926
DATED : November 8, 1994
INVENTOR(S) : FUKUDA ET AL It is certified that error appears in the above-identified patent and that said Letters Patent is hereby corrected as shown below:

Column 8, line 26, claim 16, delete "9 82 m to 70 $\mu$m" and insert therefor --9 $\mu$m to 70 $\mu$m--.

Signed and Sealed this

Twenty-ninth Day of August, 1995

*Attest:*

BRUCE LEHMAN

*Attesting Officer*   *Commissioner of Patents and Trademarks*